(12) United States Patent
Tsorng et al.

(10) Patent No.: US 11,342,005 B2
(45) Date of Patent: May 24, 2022

(54) ISOLATED VIBRATION STRUCTURE FOR FAN BAY MODULE AND HDD CAGE

(71) Applicant: Quanta Computer Inc., Taoyuan (TW)

(72) Inventors: Yaw-Tzorng Tsorng, Taoyuan (TW); Zhao-Hong Chen, Taoyuan (TW); Chun Chang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 50 days.

(21) Appl. No.: 16/813,354

(22) Filed: Mar. 9, 2020

(65) Prior Publication Data

US 2021/0201959 A1 Jul. 1, 2021

Related U.S. Application Data

(60) Provisional application No. 62/954,372, filed on Dec. 27, 2019.

(51) Int. Cl.
| | |
|---|---|
| *G11B 33/08* | (2006.01) |
| *F04D 29/66* | (2006.01) |
| *G11B 33/14* | (2006.01) |
| *H05K 7/20* | (2006.01) |
| *G06F 1/18* | (2006.01) |
| *G06F 1/20* | (2006.01) |
| *G11B 33/04* | (2006.01) |

(52) U.S. Cl.
CPC ............ *G11B 33/08* (2013.01); *F04D 29/668* (2013.01); *G06F 1/187* (2013.01); *G06F 1/20* (2013.01); *G11B 33/0466* (2013.01); *G11B 33/14* (2013.01); *H05K 7/20172* (2013.01)

(58) Field of Classification Search
CPC ..... G11B 33/08; G11B 33/128; G11B 19/048; G11B 33/14; G11B 33/124; G06F 1/187; G06F 1/181; G06F 3/0689; G06F 1/182; H05K 7/1411; F16F 15/022; F16F 15/0237; F16F 15/04; F16F 13/10; F16F 15/06; F05D 2260/96; F04D 29/668
USPC ............. 361/679.02, 679.34, 679.35, 679.36
See application file for complete search history.

(56) References Cited

U.S. PATENT DOCUMENTS

| | | | |
|---|---|---|---|
| 6,487,071 B1 * | 11/2002 | Tata ........................ | G11B 33/08 235/487 |
| 2008/0266779 A1 * | 10/2008 | Thomas ................... | G06F 1/187 361/679.34 |
| 2009/0097195 A1 * | 4/2009 | Colligan ................. | G06F 1/187 361/679.34 |
| 2013/0342996 A1 * | 12/2013 | Fricker ................ | H05K 7/1441 361/695 |

(Continued)

*Primary Examiner* — Mandeep S Buttar
(74) *Attorney, Agent, or Firm* — Nixon Peabody LLP

(57) ABSTRACT

An isolated vibration assembly for a computing device includes a top assembly having a top plate. The assembly further includes a base assembly having a base plate that is generally parallel to and offset from the top plate. A partition assembly is positioned generally perpendicularly between the top plate and the bottom plate, with two partition plates defining an internal space. A plurality of vibration isolators is attached in an interspersed manner to one or more surfaces of the top plate, the base plate, or the two partition plates. A computing device is removably installed within the internal space, generating vibrations that are reduced when passing through the plurality of vibration isolators.

15 Claims, 22 Drawing Sheets

(56) References Cited

U.S. PATENT DOCUMENTS

2014/0347810 A1* 11/2014 Huang .................... G06F 1/187
  361/679.33
2016/0217097 A1* 7/2016 Gomez ................... G06F 1/187
2018/0146569 A1* 5/2018 Schroeder ............ G11B 33/027

* cited by examiner

ISOLATED VIBRATION STRUCTURE FOR FAN BAY MODULE AND HDD CAGE

CROSS-REFERENCE TO RELATED APPLICATIONS

This application claims priority under 35 U.S.C. § 119 to and the benefit of U.S. Provisional Patent Application Ser. No. 62/954,372, filed on Dec. 27, 2019, and titled "The Isolated Vibration Structure Applied To The Fan Bay Module And HDD Cage," which is incorporated herein by reference in its entirety.

FIELD OF THE INVENTION

The present invention relates generally to reduction of vibrations in a computing device, and more specifically, to a vibration isolation structure for reducing vibration generated in a fan bay module or a hard disk drive (HDD) cage.

BACKGROUND OF THE INVENTION

Typical current computer systems require structural assemblies for supporting various internal components that are adversely affected by vibrations. For example, internal computer cooling fans and hard disk drives HDDs generate vibrations that are detrimental to the computer systems. The vibrations tend to propagate through the structural components, eventually resulting in destroying or limiting the operational time of the HDDs, fans, or other similar components.

The present disclosure is directed to providing an isolated vibration structure that solves the above problems and other needs.

SUMMARY OF THE INVENTION

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings and each claim.

According to one aspect of the present disclosure, an isolated vibration assembly is directed to a computing device. The isolated vibration assembly includes a top assembly having a top plate, and a base assembly having a base plate that is generally parallel to and offset from the top plate. The isolated vibration assembly further includes a partition assembly positioned generally perpendicularly between the top plate and the bottom plate. The partition assembly has two partition plates defining an internal space. The isolated vibration assembly further includes a plurality of vibration isolators that is attached in an interspersed manner to one or more surfaces of the top plate, the base plate, or the two partition plates. The isolated vibration assembly also includes a computing device that is removably installed within the internal space. The computing device generates vibrations that are reduced when passing through the plurality of vibration isolators.

According to one implementation of the above aspect, the computing device is a fan module or a hard disk drive (HDD). According to another implementation of the above aspect, each of the plurality of vibration isolators consists of a material selected from a group consisting of a rubber material and a spring material. According to yet another implementation of the above aspect, each of the plurality of vibration isolators is in direct contact with the one or more surfaces.

According to yet another implementation of the above aspect, each of the plurality of vibration isolators has a generally circular shape with an internal through-hole. According to yet another implementation of the above aspect, each of the plurality of vibration isolators receives within the internal through-hole a securing post for frictional fastening to the one or more surfaces. According to yet another implementation of the above aspect, each of the plurality of vibration isolators receives within the internal through-hole a screw for attachment to the one or more surfaces.

According to another aspect of the present disclosure, an isolated vibration assembly is directed to a fan bay module. The isolated vibration assembly includes a fan bay module having a plurality of fan-receiving compartments. Each compartment of the plurality of fan-receiving compartments contains a plurality of vibration isolators. Each compartment of the plurality of fan-receiving compartments is defined, at least in part, by a top assembly having a top plate and a top damping bracket. One or more of the plurality of vibration isolators is attached to a top surface of the top plate. The top damping bracket is attached to a bottom surface of the top plate. Each compartment of the plurality of fan-receiving compartments is further defined by a base assembly having a base plate and a base damping bracket. One or more of the plurality of vibration isolators is attached to a bottom surface of the base plate. The base damping bracket is attached to a top surface of the base plate. Each compartment of the plurality of fan-receiving compartments is further defined by a left partition assembly having a left plate and a left damping bracket. One or more of the plurality of vibration isolators is positioned between the left plate and the left damping bracket. Each compartment of the plurality of fan-receiving compartments is further defined by a right partition assembly having a right plate and a right damping bracket. One or more of the plurality of vibration isolators is positioned between the right plate and the right damping bracket. The isolated vibration assembly further includes a plurality of computer fans removably installed within the fan bay module. Each fan of the plurality of computer fans is removably installed within a respective compartment of the plurality of fan-receiving compartments. Each fan of the plurality of computer fans generates vibrations that are reduced when passing through any of the plurality of vibration isolators.

According to one implementation of the above aspect, the plurality of fan-receiving compartments is arranged in an array forming a plurality of rows and a plurality of columns. According to one configuration of the above implementation, the base assembly forms a middle base assembly between a top row and a bottom row of the plurality of rows. According to a more specific implementation of the above configuration, the middle base assembly further includes another base damping bracket attached to a bottom surface of the base plate. One or more of the plurality of vibration isolators is attached to a bottom surface of the base plate.

According to another implementation of the above aspect, at least one of the partition assembly and the right partition assembly includes a flap rotatably attached to one end of the respective left plate or right plate. According to yet another implementation of the above aspect, the vibrations propagate in at least four directions around each fan, the at least four directions including a top direction, a bottom direction, a left direction, and a right direction.

According to yet another implementation of the above aspect, each fan of the plurality of computer fans is in direct contact with at least one of the top damping bracket, the base damping bracket, the left damping bracket, and the right damping bracket. According to yet another implementation of the above aspect, each of the plurality of vibration isolators consists of a material selected from a group consisting of a rubber material and a spring material.

According to yet another aspect of the present disclosure, an isolated vibration assembly is directed to a hard disk drive (HDD) cage. The isolated vibration assembly includes a HDD cage assembly having a HDD cage top cover and a HDD cage base that is generally parallel to and offset from the HDD cage top cover. The HDD cage assembly further has a plurality of HDD cage partition assemblies that are mounted between the HDD cage top cover and the HDD cage base. Each HDD cage partition assembly includes a HDD right cage partition, a HDD left cage partition, and a HDD cage support bracket. The HDD cage support bracket is attached between the HDD right cage partition and the HDD left cage partition in a sandwich structural manner. The isolated vibration assembly further includes a HDD tray top cover assembly that is attached to a top surface of the HDD cage top cover and a HDD tray bottom cover assembly that is attached to a bottom surface of the HDD cage base. The isolated vibration assembly also includes a HDD tray base assembly that is attached to a bottom surface of the HDD tray bottom cover. The isolated vibration assembly also includes a plurality of vibration isolators that is attached in an interspersed manner to one or more surfaces of at least the HDD tray top cover assembly and the HDD tray bottom cover assembly. The isolated vibration assembly also includes at least one HDD removably attached within a compartment formed within the HDD cage assembly. The HDD generates vibrations that are reduced when passing through any of the plurality of vibration isolators.

According to one implementation of the above aspect, the isolated vibration assembly further includes rivets for attaching the HDD tray top cover assembly and the HDD tray bottom cover assembly to the plurality of HDD cage partition assemblies. According to another implementation of the above aspect, the vibrations propagate in at least two directions around the HDD. The at least two directions include a top direction and a bottom direction.

According to yet another implementation of the above aspect, the HDD cage assembly forms a plurality of compartments. Each of the plurality of compartments receives a respective HDD. The plurality of compartments is arranged in an array that forms at least one row and a plurality of columns. According to yet another implementation of the above aspect, each of the plurality of vibration isolators consists of a material selected from a group consisting of a rubber material and a spring material.

The above summary is not intended to represent each embodiment or every aspect of the present disclosure. Rather, the foregoing summary merely provides an example of some of the novel aspects and features set forth herein.

The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims.

Figure 1:
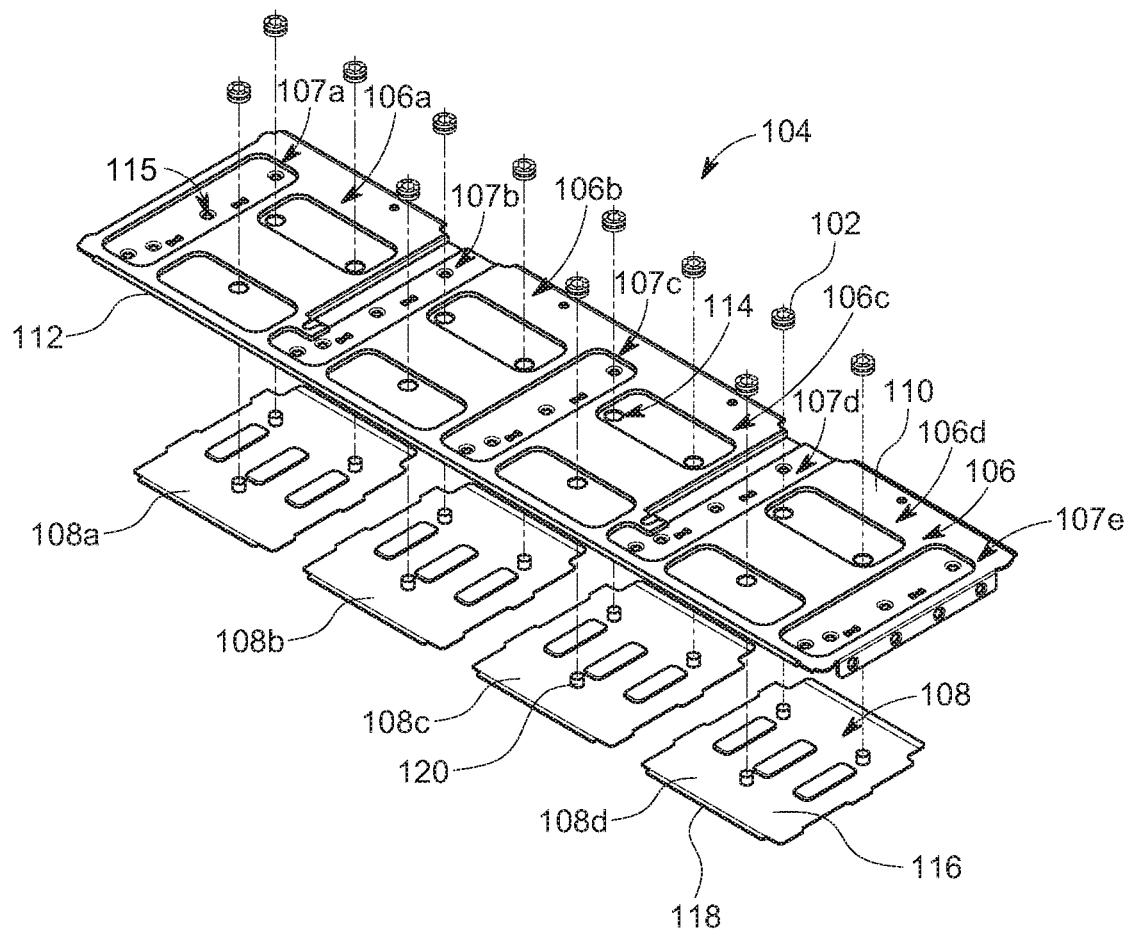
FIG. 1 is an exploded perspective view of a top cover assembly for a fan bay module.

While the invention is susceptible to various modifications and alternative forms, specific implementations have been shown by way of example in the drawings and will be described in further detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Various embodiments are described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," "generally," and the like, can be used herein to mean "at," "near," or "nearly at," or "within 3-5% of," or "within acceptable manufacturing tolerances," or any logical combination thereof, for example.

The present disclosure generally describes an isolated vibration structure for use in computer structures, such as a fan bay module or an HDD cage. The isolated vibration structure includes an elastic medium that reduces vibration transmission generated by moving components (e.g., fans, HDDs). The elastic medium includes, for example, a rubber or spring material and is generally in the form of a plurality of distinct vibration isolators. The vibration isolators are inserted in the isolated vibration structure, for reducing vibration transmission, when assembling respective computer modules.

In addition or alternative to the vibration isolators, the present disclosure also describes an advantageous floating design configuration that also reduces vibration transmission. The floating design relies at least in part on the vibration isolators to isolate structural elements from each other in reference to vibration propagation. Yet another benefit of the present disclosure is directed to increasing the structure strength of a computer structure via a sandwich-type configuration, while maintaining the floating design configuration. The more-detailed disclosure provided below further presents specific details of these and other benefits.

Referring generally to FIGS. 1-8, an isolated vibration structure 100 is in the form of a fan bay module (shown in full in FIGS. 7 and 8) that includes a plurality of vibration isolators 102. The vibration isolators 102 are interspersed throughout various components and attached to various surfaces.

Referring specifically to FIG. 1, a top cover assembly 104 includes a top plate 106, a top damping bracket 108, and a plurality of vibration isolators 102. The top plate 106 has a top surface 110 and a bottom surface 112, with isolator holes 114 and mounting holes 115 passing through a thickness of the top plate 106 between the top surface 110 and the bottom surface 112. The isolator holes 114 and the mounting holes 115 have a general circular shape, as discussed in more detail below in reference to FIGS. 22-24.

Figure 7:
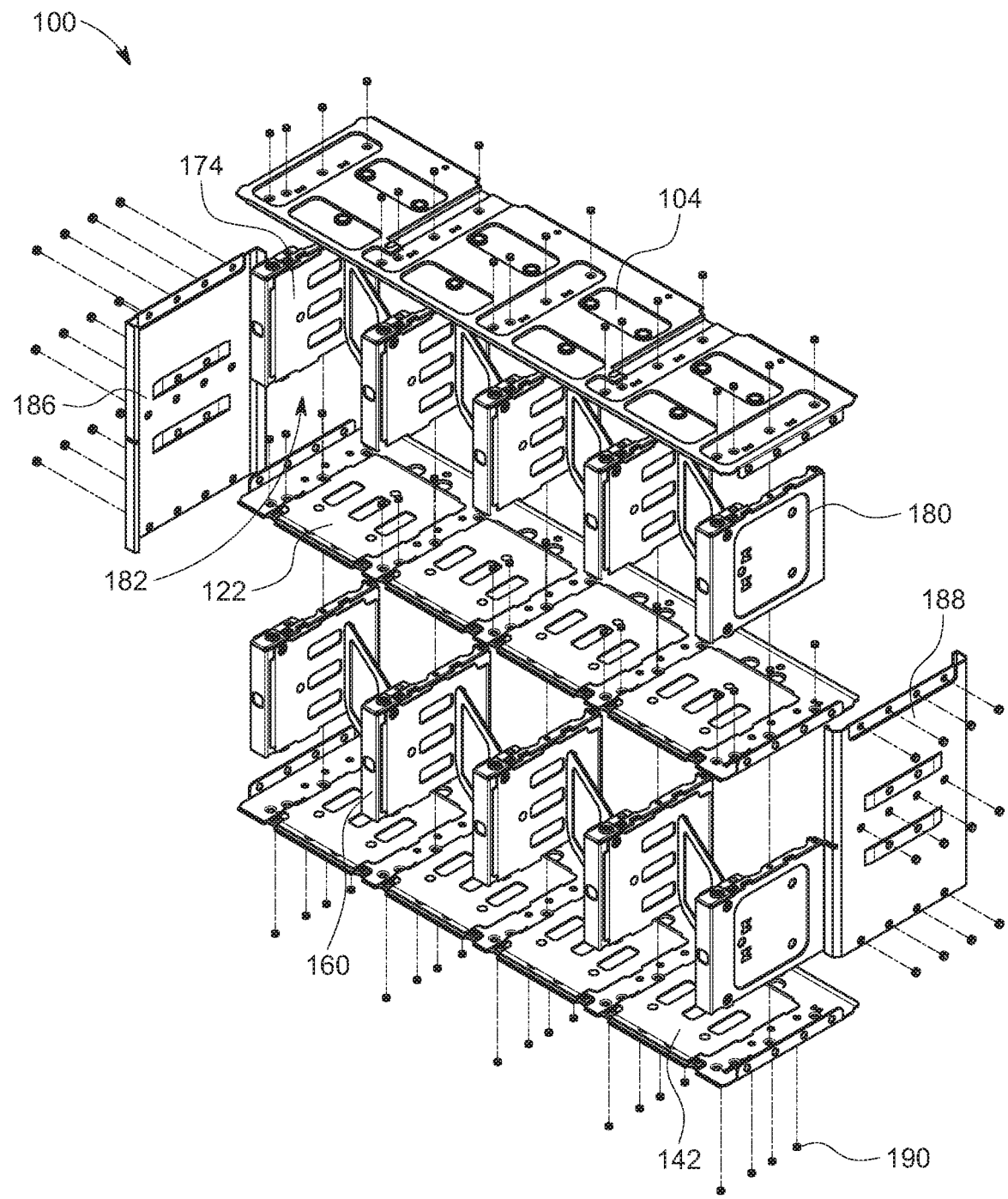
FIG. 7 is an exploded perspective view of the fan bay module.
Figure 8:
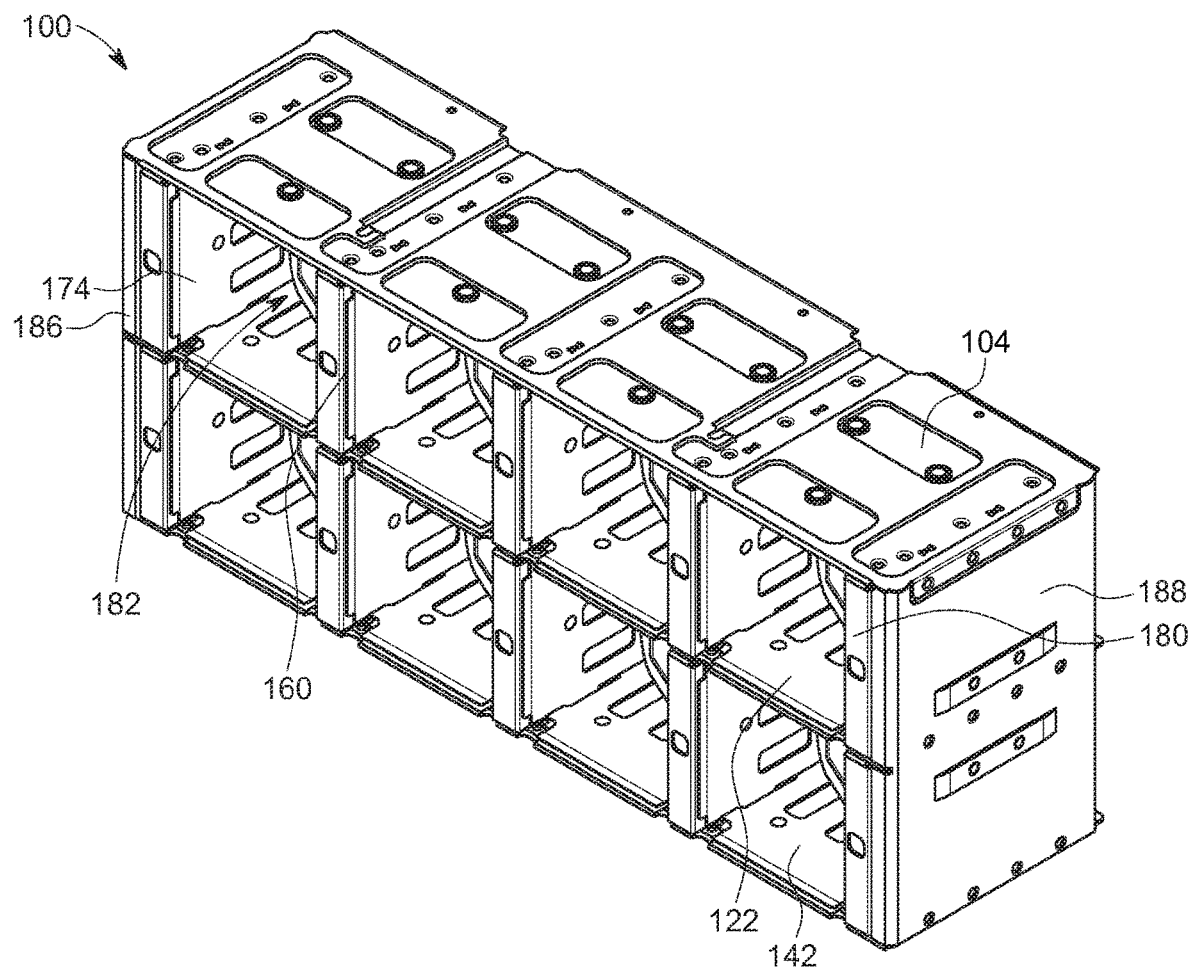
FIG. 8 is an assembled perspective view of the fan bay module.

The top plate 106 further has a plurality of top plate sections 106a-106d that are connected via a plurality of top bridging areas 107a-107e. Although not specifically shown in FIG. 1, fasteners (e.g., screws or rivets) are inserted through the mounting holes 115 for assembly of the top cover assembly 104 in the fan bay module 100 (as illustrated in FIGS. 7 and 8).

The top damping bracket 108 has a top surface 116 and a bottom surface 118, with mounting posts 120 extending from the top surface 116 towards the bottom surface 112 of the top plate 106. The mounting posts 120 have a general circular shape with a diameter that is smaller than a diameter of the isolator holes 114. The smaller diameter facilitates the insertion of the mounting posts 120 through respective ones of the isolator holes 114.

According to the illustrated embodiment, the top damping bracket 108 is illustrated having several, separate bracket sections 108a-108d. For clarity and ease of disclosure, the separate bracket sections 108a-108d are collectively referred to as the top damping bracket 108. When assembled, each section 108a-108d is generally fastened to a respective section 106a-106d of the top plate via the mounting posts 118.

Figure 2:
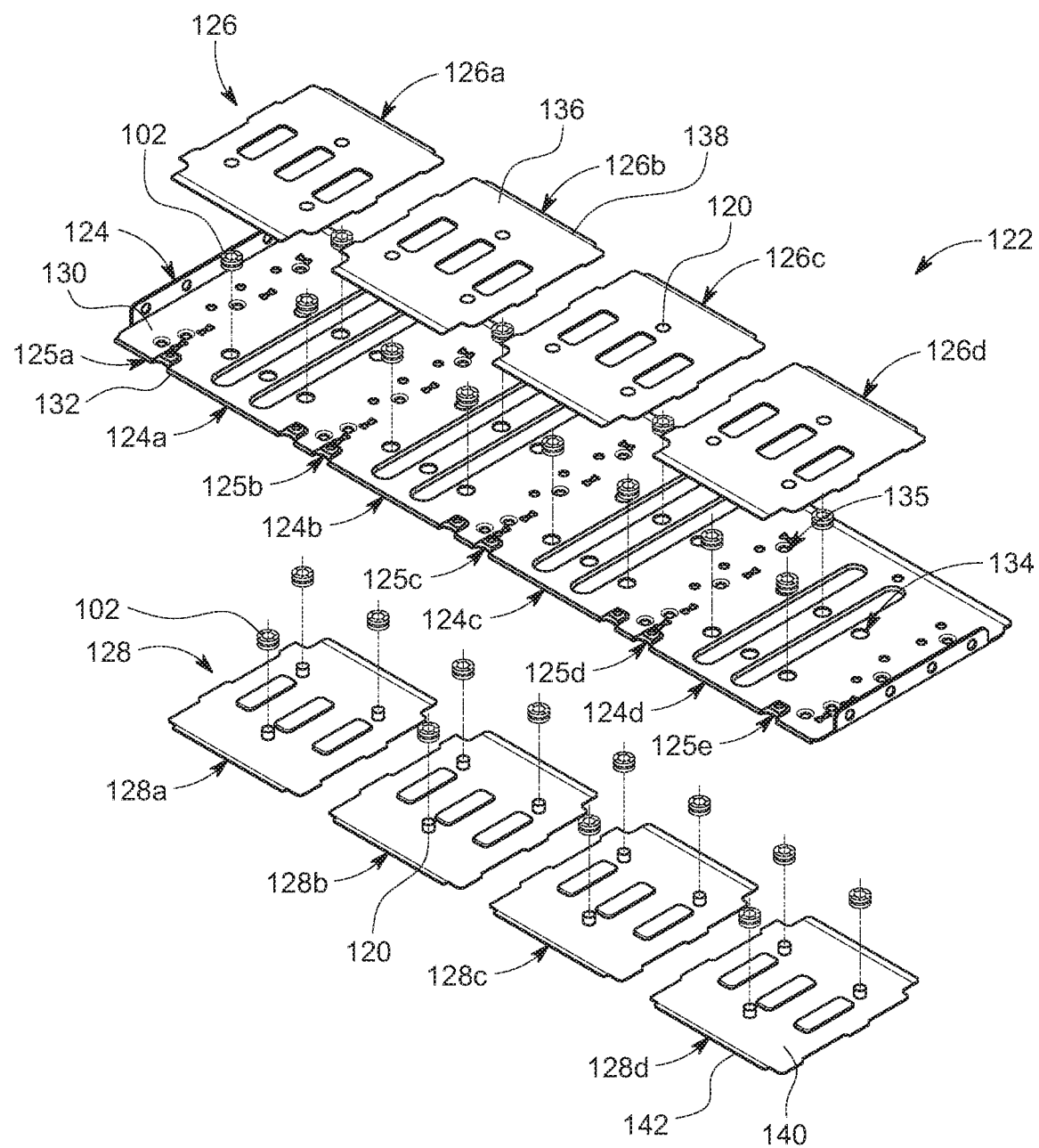
FIG. 2 is an exploded perspective view of a middle base assembly for the fan bay module.

Referring specifically to FIG. 2, a middle base assembly 122 includes a middle plate 124, a middle-top damping bracket 126, a middle-bottom damping bracket 128, and another plurality of vibration isolators 102. The middle plate 124 has a top surface 130 and a bottom surface 132. The middle plate 124 has isolator holes 134 (which are similar to the isolator holes 114 of the top plate 106) and mounting holes 135 (which are similar to the mounting holes 115 of the top plate 106). The middle plate 124 has a plurality of middle plate sections 124a-124e and a plurality of middle bridging areas 125a-125d.

The middle-top damping bracket 126 has a top surface 136 and a bottom surface 138, with respective mounting posts 120 that are similarly configured to the mounting posts 120 of the top damping bracket 108 (shown in FIG. 1). Similar to the top damping bracket 108, the middle-top damping bracket 126 has several bracket sections 126a-126d. The middle-bottom damping bracket 128 has a top surface 140 and a bottom surface 142, with respective mounting posts 120 that are similarly configured as the mounting posts 120 of the top damping bracket 108. Similar to the top damping bracket 108, the middle-bottom damping bracket 128 has several bracket sections 128a-128d.

When assembled, the middle base assembly 122 has several layers that includes (from top to bottom) the middle-top damping bracket 126, a top layer of vibration isolators 102, the middle plate 124, a bottom layer of vibration isolators 102, and the middle-bottom damping bracket 128. The assembly of the middle base assembly 112 is achieved similar to the top cover assembly 104.

Figure 3:
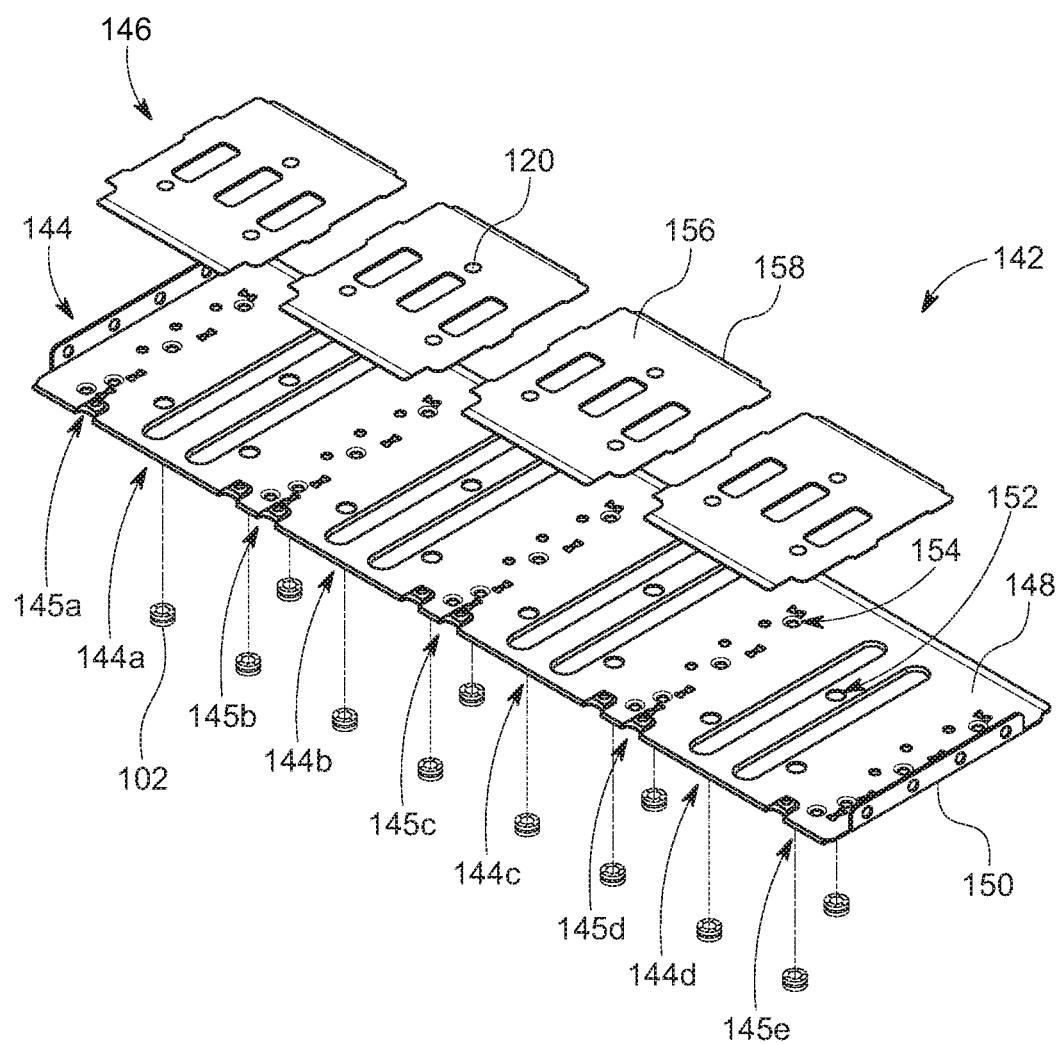
FIG. 3 is an exploded perspective view of a base assembly for the fan bay module.

Referring specifically to FIG. 3, a base assembly 142 includes a base plate 144, a base damping bracket 146, and another plurality of vibration isolators 102. The base plate 144 has a top surface 148 and a bottom surface 150. The base plate 144 has isolator holes 152, which are similar to the isolator holes 114 of the top plate 106, and mounting holes 154, which are similar to the mounting holes 115 of the top plate 106 (shown in FIG. 1). The base plate 144 has a plurality of base plate sections 144a-144e and a plurality of base bridging areas 145a-145d.

The base damping bracket 146 has a top surface 156 and a bottom surface 158, with respective mounting posts 120 that are similarly configured as the mounting posts 120 of the top damping bracket 108 (shown in FIG. 1). Similar to the top damping bracket 108, the base damping bracket 146 has several bracket sections 146a-146d.

When assembled, the base assembly 142 has several layers that includes (from top to bottom) the base damping bracket 146, the base plate 144, and a layer of vibration isolators 102. The assembly of the base assembly 142 is achieved similar to the top cover assembly 104 (shown in FIG. 1).

Figure 4:
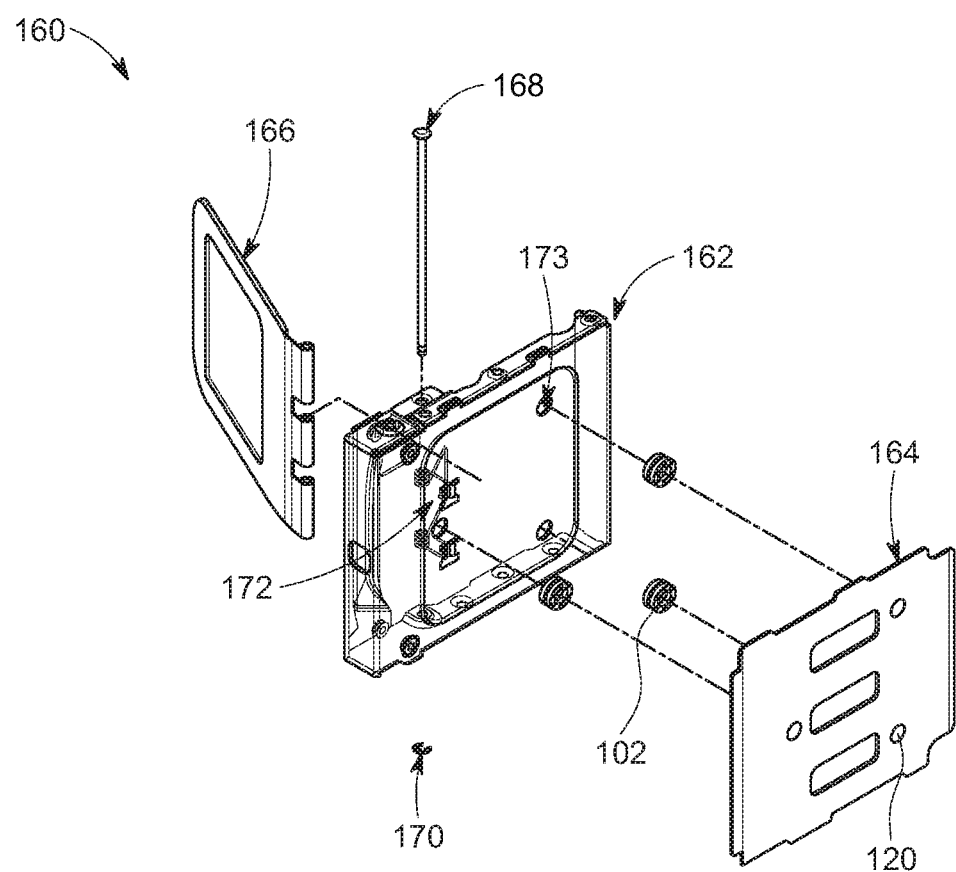
FIG. 4 is an exploded perspective view of a partition assembly for the fan bay module.

Referring specifically to FIG. 4, an interior partition assembly 160 includes an interior partition plate 162, a partition damping bracket 164, a partition flap 166, a pin 168, a C-ring 170, a spring 172, and another plurality of vibration isolators 102. Upon assembly, the partition flap 166 is rotatably fixed to the interior partition plate 162 via the pin 168. The pin 168 is secured in place with the C-ring 170. The spring 172 provides sufficient resistance for maintaining the partition flap 166 in a closed position in which the partition flap 166 is generally in contact with the interior partition plate 162.

The partition damping bracket 164 includes mounting posts 120 that are similarly configured as the mounting posts 120 of the top damping bracket 108. The mounting posts 120 extend between the partition damping bracket 164 and the interior partition plate 162. The vibration isolators 102 are also located between the partition damping bracket 164 and the interior partition plate 162. The interior partition plate 162 further has isolator holes 173 that are similar to the isolator holes 114 of the top pate 106.

Figure 5:
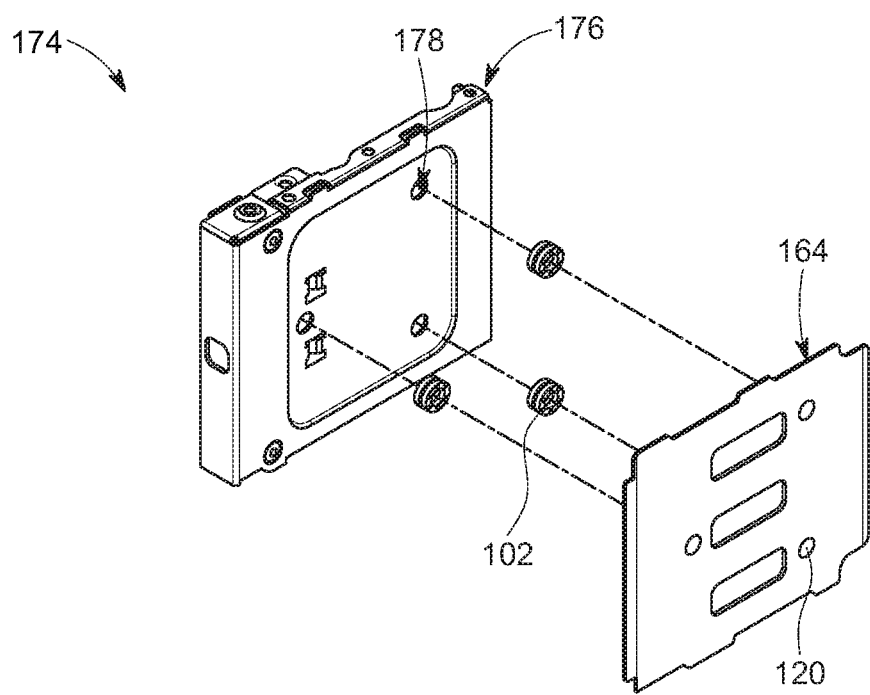
FIG. 5 is an exploded perspective view of a left partition assembly for the fan bay module.

Referring specifically to FIG. 5, a left partition assembly 174 includes a left partition plate 176. The left partition 176 is connected to a respective partition damping bracket 164 with another plurality of vibration isolators 102 fixed on respective mounting posts 120. The vibration isolators 102 and the mounting posts 120 are located between the left partition plate 176 and the partition damping bracket 164. The left partition plate 176 further has isolator holes 178 that are similar to the isolator holes 114 of the top pate 106.

Figure 6:
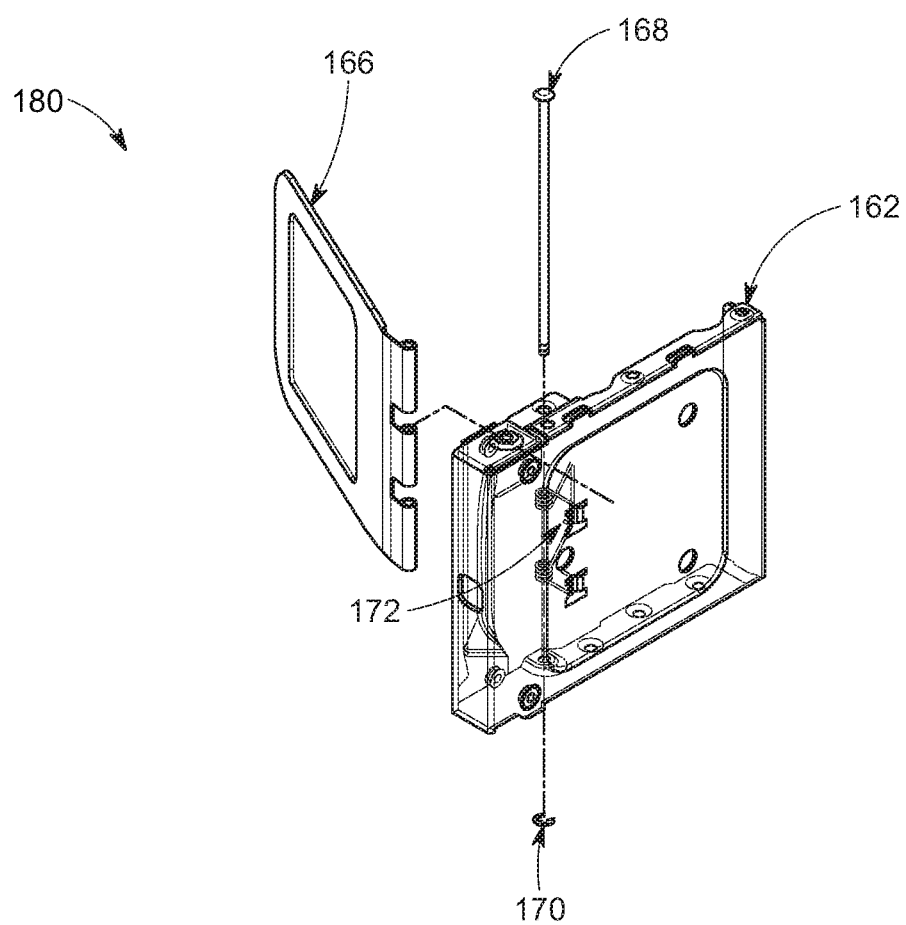
FIG. 6 is an exploded perspective view of a right partition assembly for the fan bay module.

Referring specifically to FIG. 6, a right partition assembly 180 is generally similar to the interior partition assembly 160 (shown in FIG. 5) except that it lacks the partition damping bracket 164, the vibration isolators 102, and the mounting posts 120. Thus, the right partition assembly 180 includes an interior partition plate 162, a partition flap 166, a pin 168, a C-ring 170, and a spring 172.

Referring specifically to FIGS. 7 and 8, the assemblies described above form an exemplary embodiment of the fan bay module 100 that has an array of eight compartments 182. Each compartment 182 is an internal space for receiving a respective fan of a plurality of computer fans 184 (shown in FIG. 11). Specifically, the fan bay module 100 has an external frame that is formed from the top cover assembly 104 (top), the base assembly 142 (bottom), a left side bracket 186 (left), and a right side bracket 188 (right).

The middle base assembly 122 divides horizontally the internal structure of the fan bay module 100 into two rows. Three sets of interior partition assemblies 160 divides each row perpendicularly into four compartments 182. Two sets of left partition assemblies 174 and two sets of right partition assemblies 180 are further assembled near respective ones of the left side bracket 186 and the right side bracket 188. The fan bay module 100 is assembled with one or more fasteners 190, such as rivets.

Figure 9:
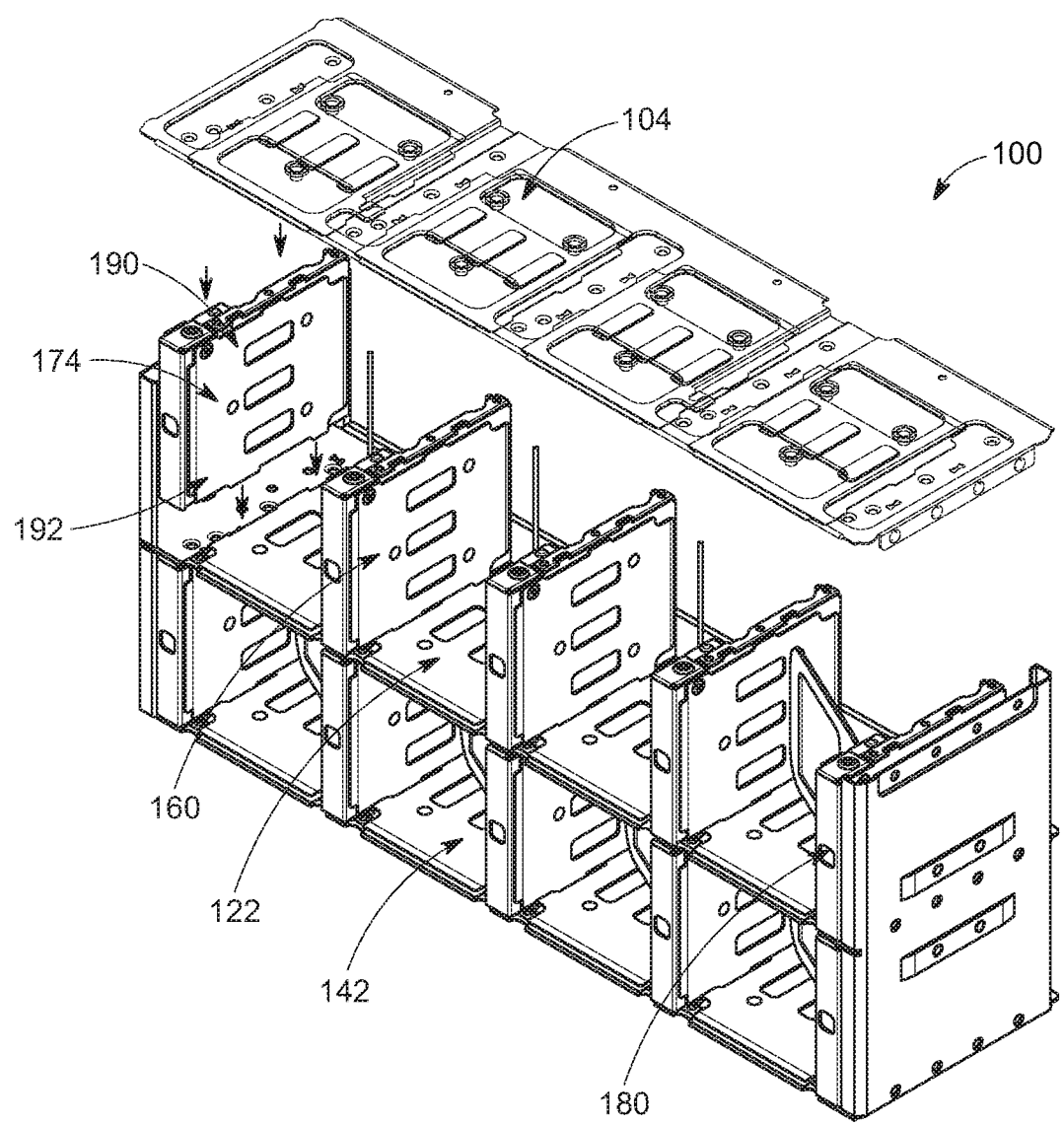
FIG. 9 is a partial exploded perspective view of the fan bay module.
Figure 10:
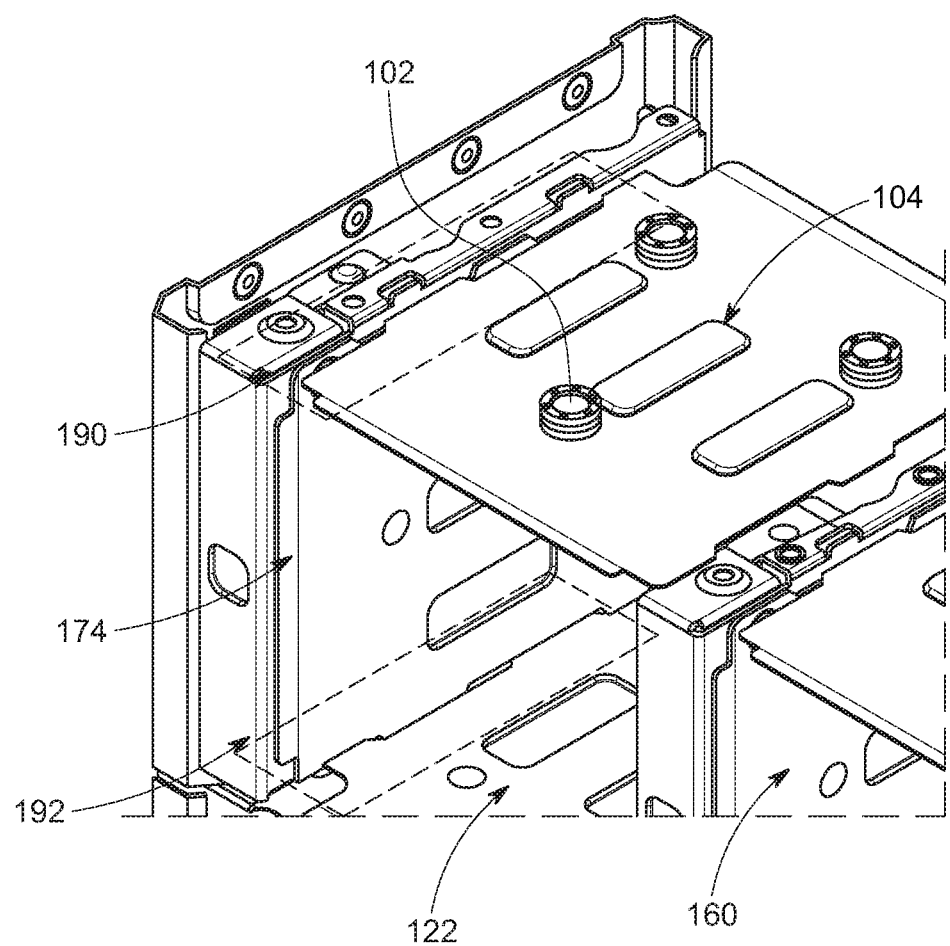
FIG. 10 is an enlarged view illustrating an assembled portion of the fan bay module of FIG. 9.

Referring to FIGS. 9 and 10, the assembly of the fan bay module 100 is achieved in part by inserting (or assembling) the partition assemblies 160, 174, 180 into the top cover assembly 104, the middle base assembly 122, and the base assembly 142. For example, as more clearly illustrated in FIG. 10, a top end 190 of the left partition assembly 174 is inserted into the top cover assembly 104, and a bottom end 192 of the left partition assembly 174 is inserted into the middle base assembly 122. The assembly reduces vibration transmission based on the included vibration isolators 102, which generally help achieve a floating-design assembly between components that limit or reduce vibrations.

Figure 11:
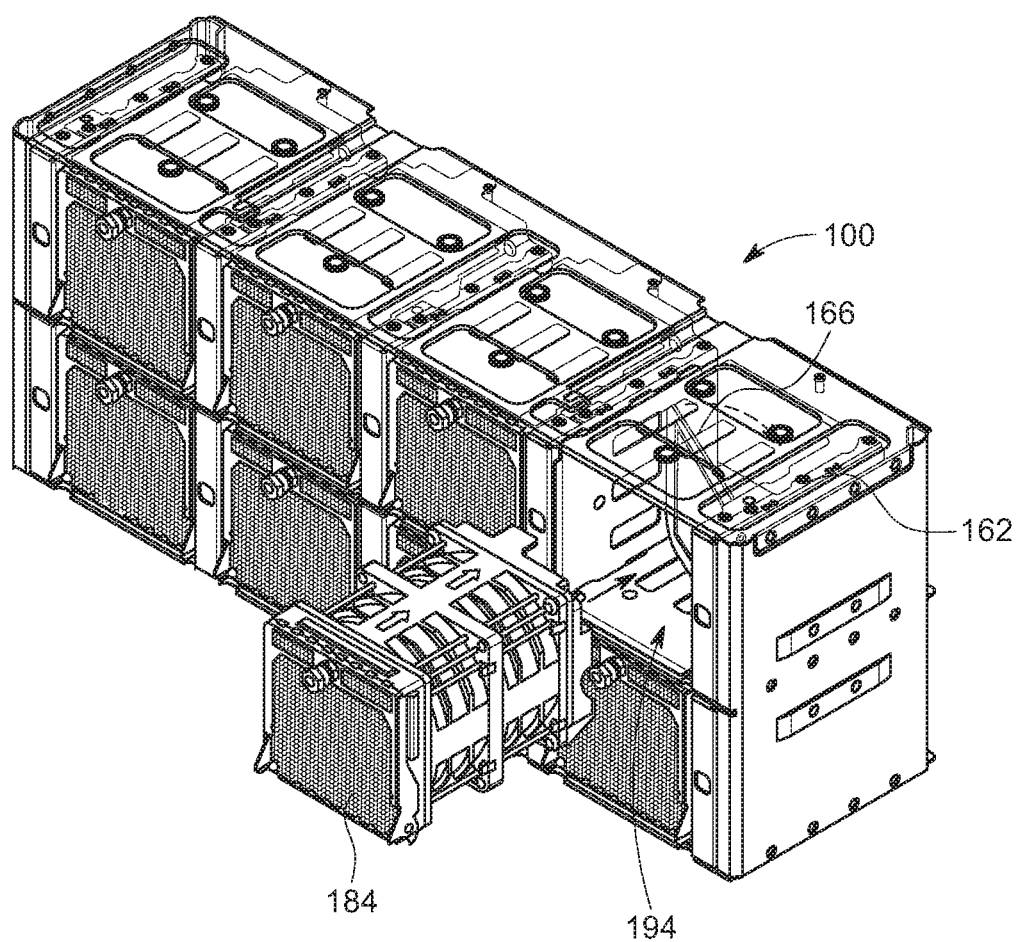
FIG. 11 is a perspective view of the fan bay module with installed fans.

Referring to FIG. 11, eight fans 184 are installed respectively in the eight compartments 182 of the fan bay module 100. Each fan is inserted through a front opening 194 of a respective compartment 182. A respective flap 166 is rotated in a clockwise direction, towards a respective partition plate 162, to provide access within the respective compartment 182 through the front opening 194.

Figure 12:
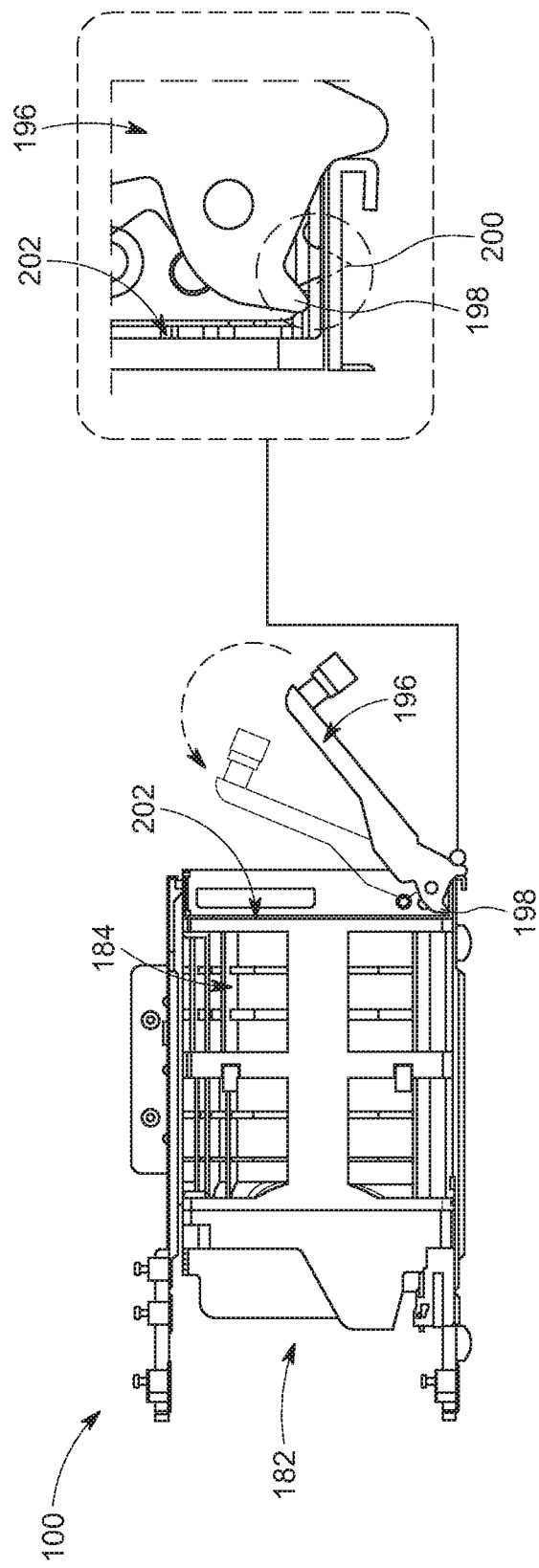
FIG. 12 is a side view with an enlarged illustration showing the installation of a fan in a compartment of the fan bay module.

Referring to FIG. 12, each fan 184 is removably fixed within a respective compartment 182 of the fan bay module 100. For example, a fan carrier lever 196 rotates in a counterclockwise direction to place a lever hook 198 in a hook retainer 200. Thus, as the fan carrier lever 196 rotates towards a back surface 202 of the fan 184, the lever hook 198 moves and is eventually inserted within the hook retainer 200. Frictional contact between the lever hook 198 and the hook retainer 200 facilitates the removable attachment between the fan 184 and the fan bay module 100.

Figure 13:
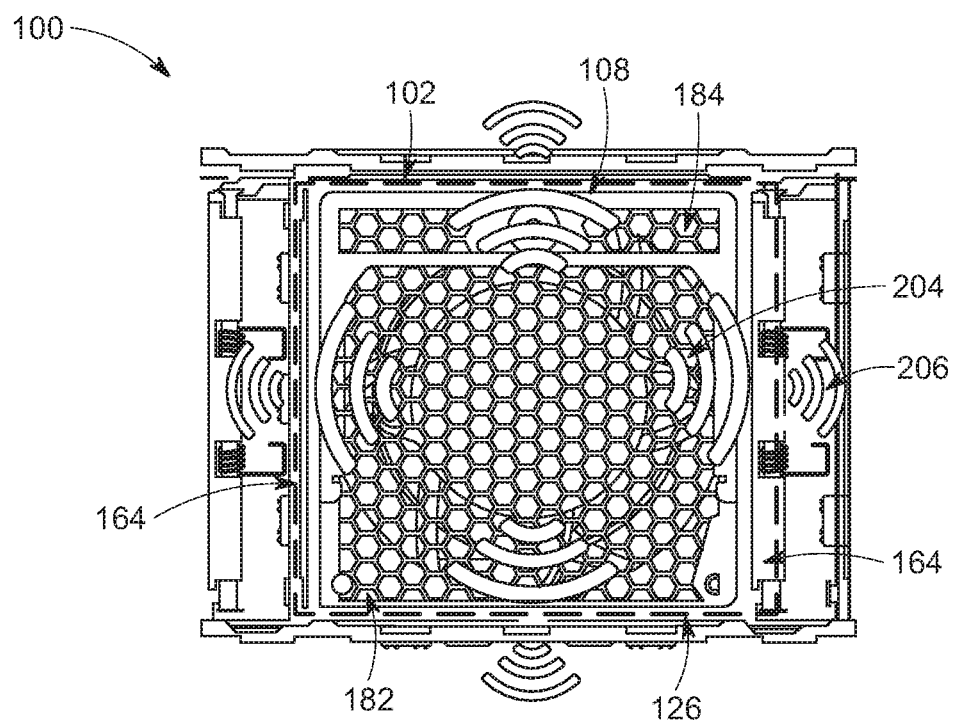
FIG. 13 is a front view illustrating vibration waves weakened by vibration isolators.

Referring to FIG. 13, each fan 184 operates as required to provide cooling to the fan bay module 100 and its associated computer components. During operation, the fan 184 is in contact with respective damping brackets within a respective compartment 182. For example, the fan 184 is in contact along a top surface with a top damping bracket 108, along a bottom surface with a middle-top damping bracket 126, along a left surface with a left partition damping bracket 164, and along a right surface with a right partition damping bracket 164. In accordance with the disclosure provided above, each damping bracket is associated with and in contact with a respective plurality of vibration isolators 102 (generally illustrated as a rectangular perimeter encircling the fan 184). The operation of the fan 184 creates an initial vibration wave 204 that passes through the plurality of vibration isolators. As a result, the initial vibration wave 204 is reduced to a weakened vibration wave 206 by the vibration isolators 102.

Referring generally now to FIGS. 14-19, the isolated vibration structure 100 is disclosed in the form of a HDD cage. For clarity, the HDD cage will be identified via reference numeral 300 (as shown in FIGS. 18-21). Similar to the fan bay module 100, the HDD cage 300 includes vibration isolators 102 (shown in FIGS. 15-17) that are interspersed throughout various components and attached to various surface. The HDD cage 300 includes similar benefits to the fan bay module 100, including reducing detrimental vibration waves.

Figure 14:
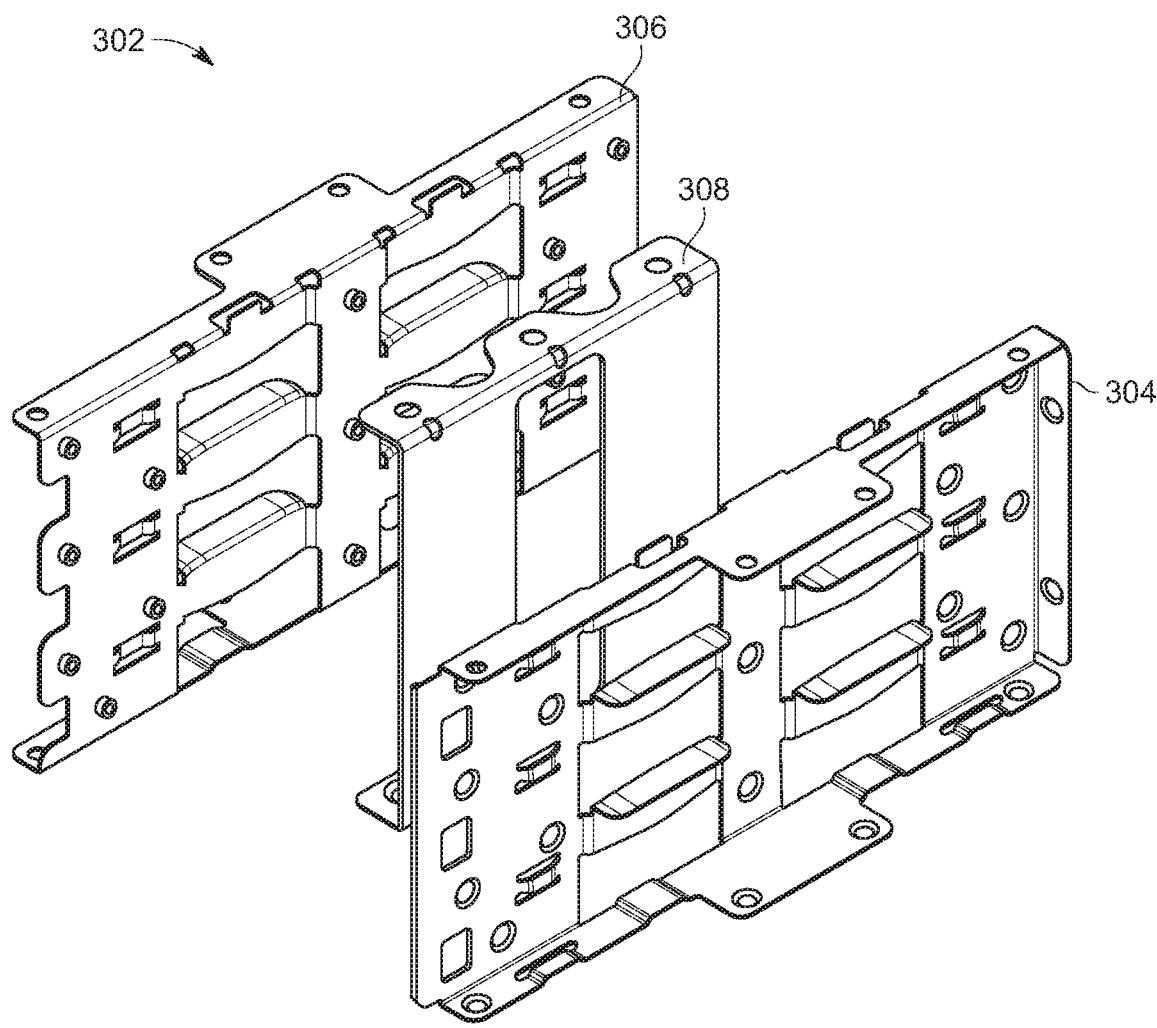
FIG. 14 is an exploded perspective view of an HDD cage partition assembly.

Referring specifically to FIG. 14, a HDD cage partition assembly 302 includes a HDD right cage partition 304, a HDD left age partition 306, and a HDD cage support bracket 308. The HDD cage support bracket 308 is attached in a sandwich structural manner between the HDD right cage partition 304 and the HDD left age partition 306.

Figure 15:
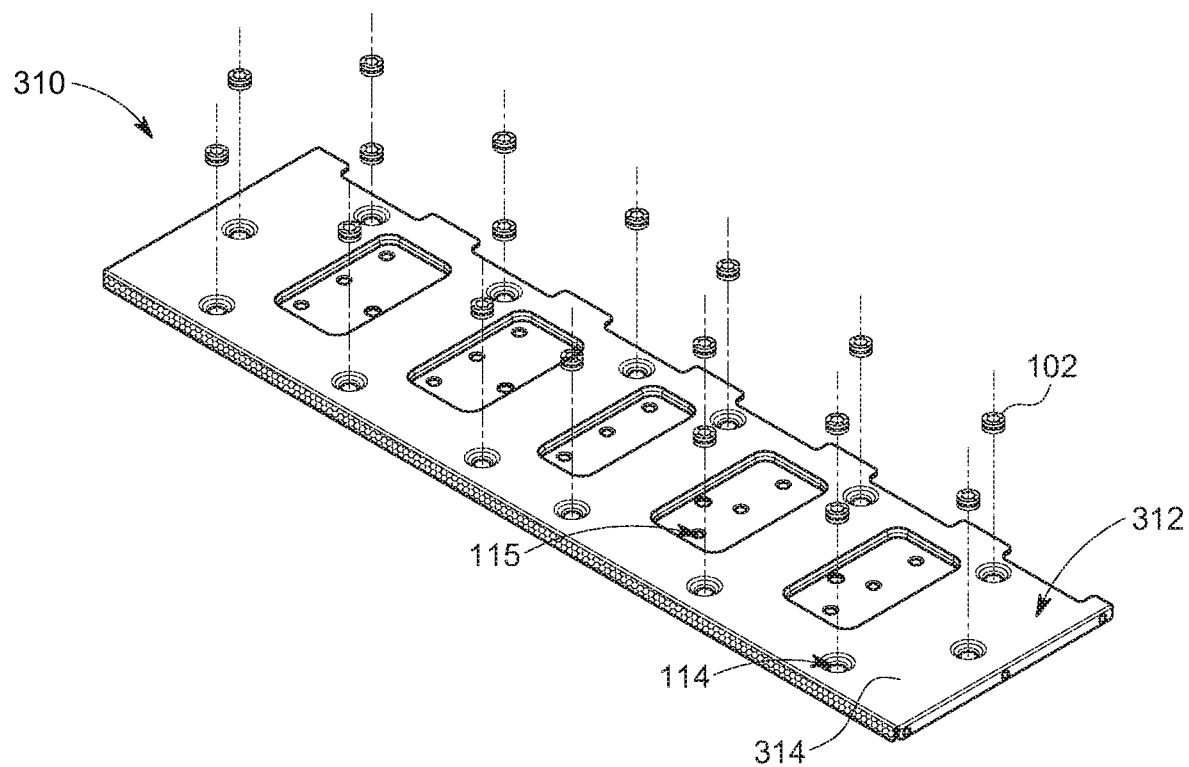
FIG. 15 is an exploded perspective view of an HDD tray top cover assembly.

Referring specifically to FIG. 15, a HDD tray top cover assembly 310 includes a HDD tray top cover plate 312 and a plurality of vibration isolators 102. The vibration isolators 102 are installed on a top surface 314 of the HDD tray top cover plate 312 in respective isolator holes 114. The HDD tray top cover plate 312 further includes mounting holes 115 for receiving fasteners (not shown) for assembly purposes. The vibration isolators 102 are installed similarly to those described above in reference to the fan bay module 100.

Figure 16:
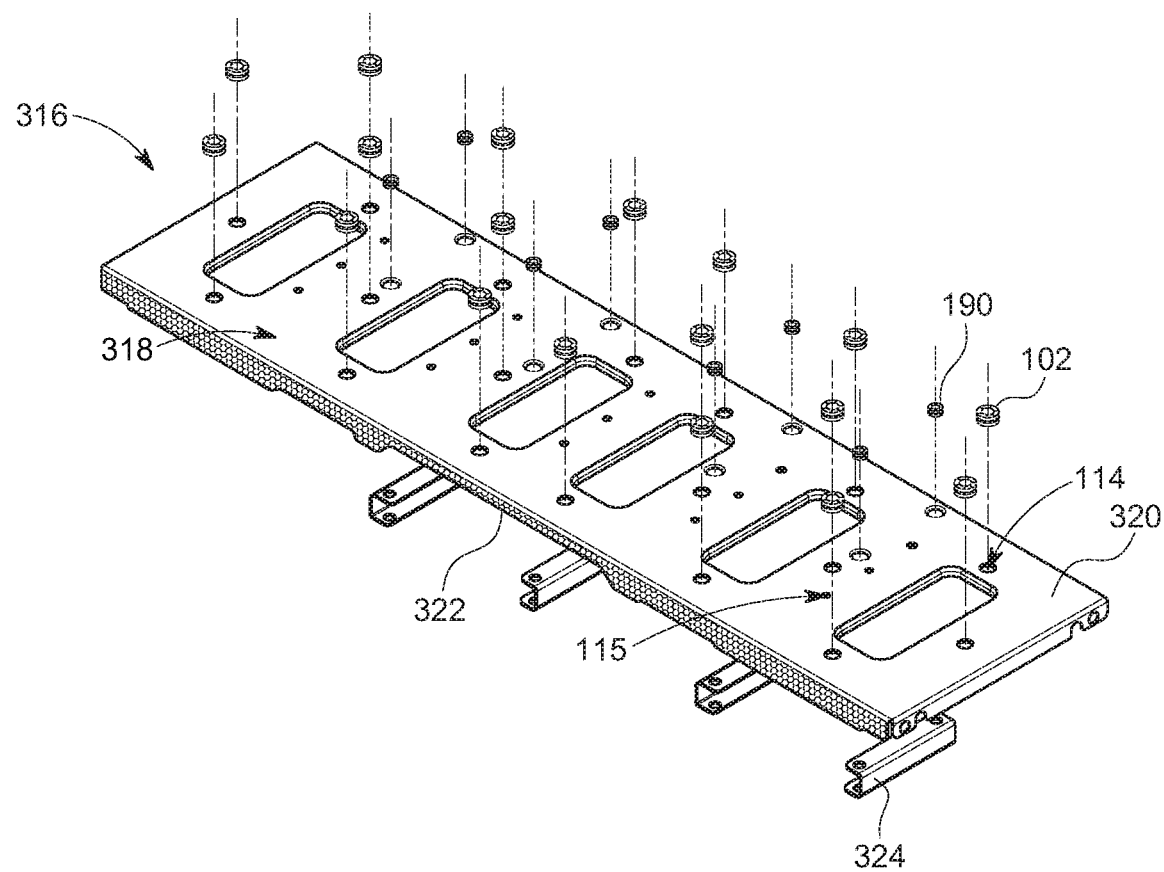
FIG. 16 is an exploded perspective view of an HDD tray bottom cover assembly.

Referring specifically to FIG. 16, a HDD tray bottom cover assembly 316 includes a HDD tray bottom cover plate 318 and a plurality of vibration isolators 102. The vibration isolators 102 are installed on a top surface 320 of the HDD tray bottom cover plate 318 in respective isolator holes 114. The vibration isolators 102 are installed similarly to those described above in reference to the fan bay module 100.

The HDD tray bottom cover plate 318 further includes, for assembly purposes, mounting holes 115 for receiving rivets 190 (or other types of fasteners). The HDD tray bottom cover plate 318 further has a bottom surface 322 along which a plurality of HDD tray support brackets 324 are attached.

Figure 17:
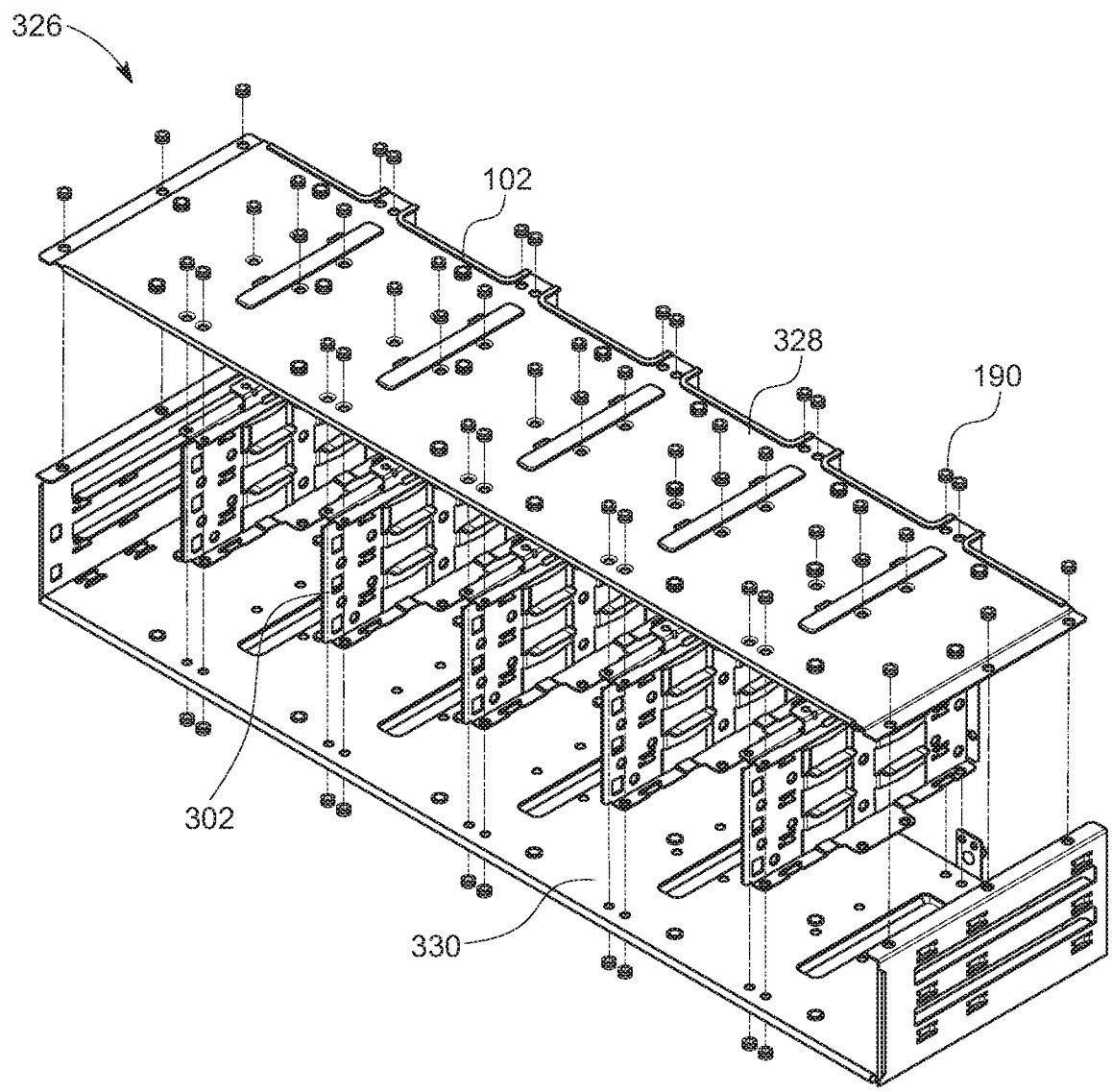
FIG. 17 is an exploded perspective view of an HDD cage assembly.

Referring specifically to FIG. 17, a HDD cage assembly 326 includes a plurality of HDD cage partition assemblies 302 assembled between a HDD cage top cover 328 and a HDD cage base 330. The HDD cage base 330 is generally parallel to and offset from the HDD cage top cover 328. Rivets 190 (or other types of fasteners) are included for assembly of the cage components to each other. Optionally, vibration isolators 102 are further installed on one or more surfaces of the HDD cage top cover 328 and/or the HDD cage base 330, as illustrated and in accordance to disclosure described above.

Figure 18:
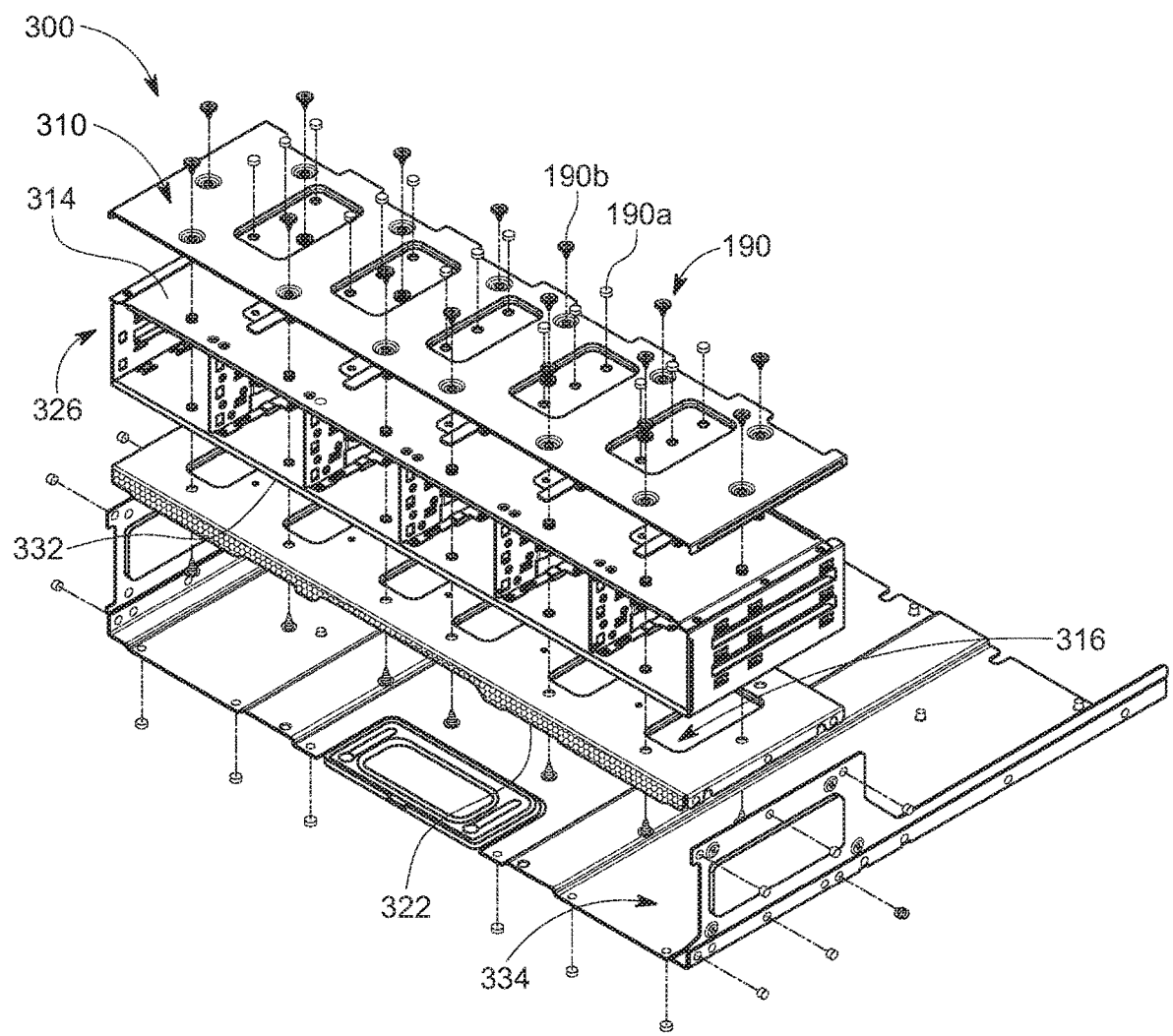
FIG. 18 is an exploded perspective view of the HDD cage assembly with an HDD tray.
Figure 19:
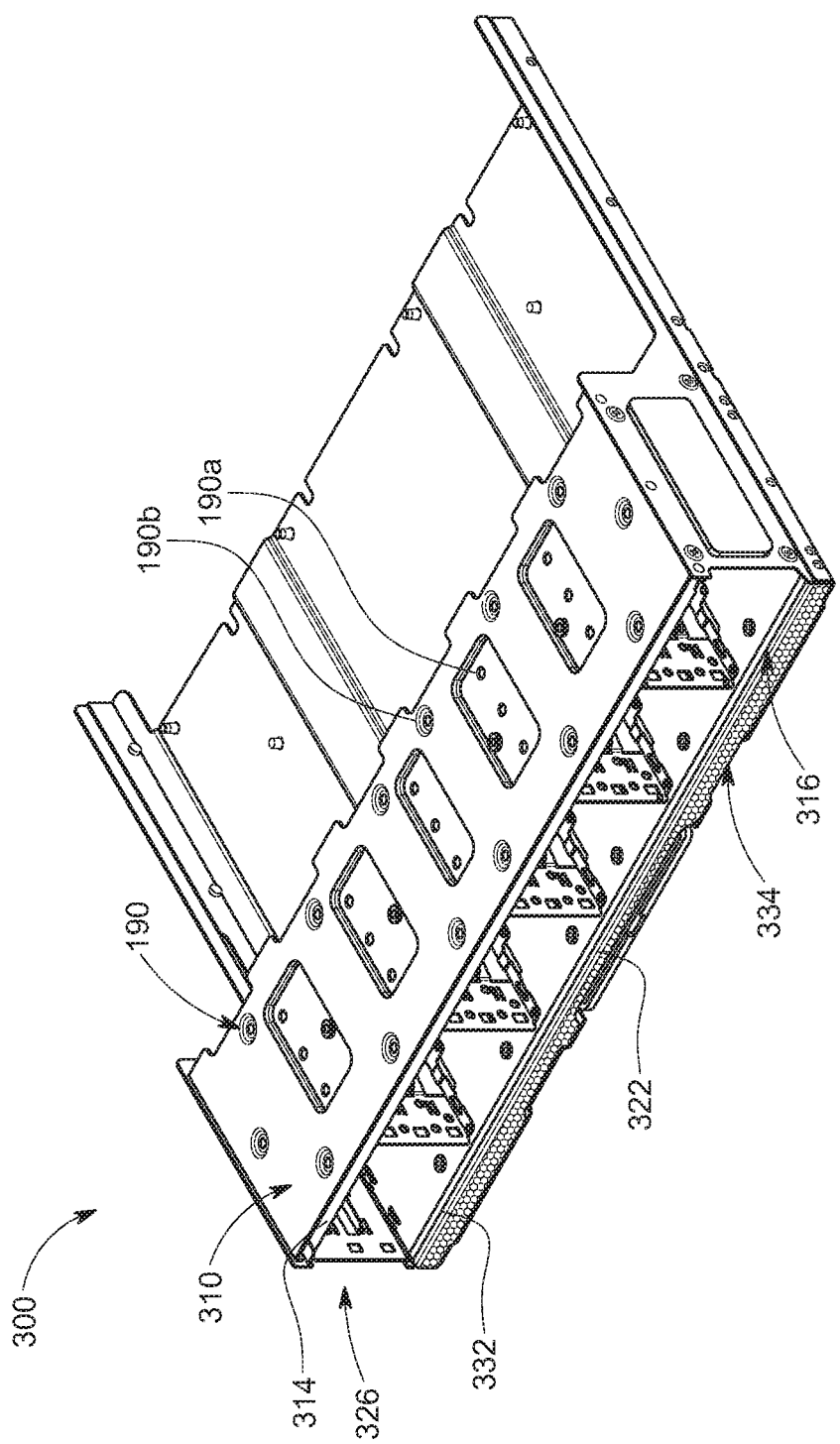
FIG. 19 is an assembled perspective view of the HDD case assembly with the HDD tray of FIG. 18.

Referring specifically to FIGS. 18 and 19, the HDD cage 300 includes the HDD cage assembly 326 connected along the top surface 314 to the HDD tray top cover assembly 310. The HDD cage assembly 326 is further connected along a bottom surface 332 to the HDD tray bottom cover assembly 316. The HDD cage 300 includes a HDD tray base assembly 334 that is attached to the bottom surface 322, below the HDD tray bottom cover assembly 316. The HDD cage 300 is assembled via a plurality of fasteners 190 that include rivets 190a and screws 190b.

Figure 20:
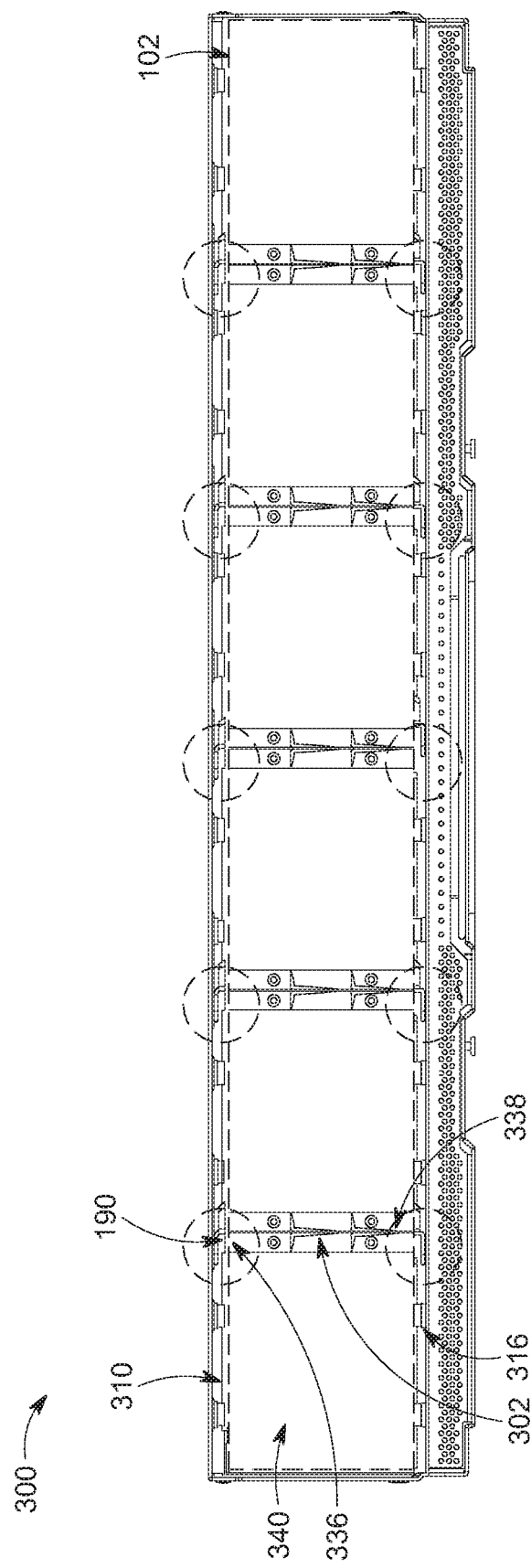
FIG. 20 is a front view illustration of the HDD cage assembly with the HDD tray.

Referring to FIG. 20, the HDD tray top cover assembly 310 is fixed to a top end 336 of the plurality of HDD cage partition assemblies 302. The HDD tray bottom cover assembly 316 is fixed to a bottom end 338 of the plurality of HDD cage partition assemblies 302. Each assembly 310, 316 is fixed via one or more of the fasteners 190. The assembled HDD cage 300 has a floating design structure that is achieved in part via the vibration isolators 102 (which are generally illustrated as a rectangular perimeter) interspersed within one or more of the assembled cage components.

The HDD cage partition assemblies 302, along with the HDD tray top cover assembly 310 and the HDD tray bottom cover assembly 316, form a plurality of compartments 340. Specifically, in the illustrated example, the HDD cage 300 has a single row of six compartments 340. In other configurations, additional rows and/or columns are included. Each compartment 340 is configured to receive a respective HDD 342 (as illustrated in FIG. 21).

Figure 21:
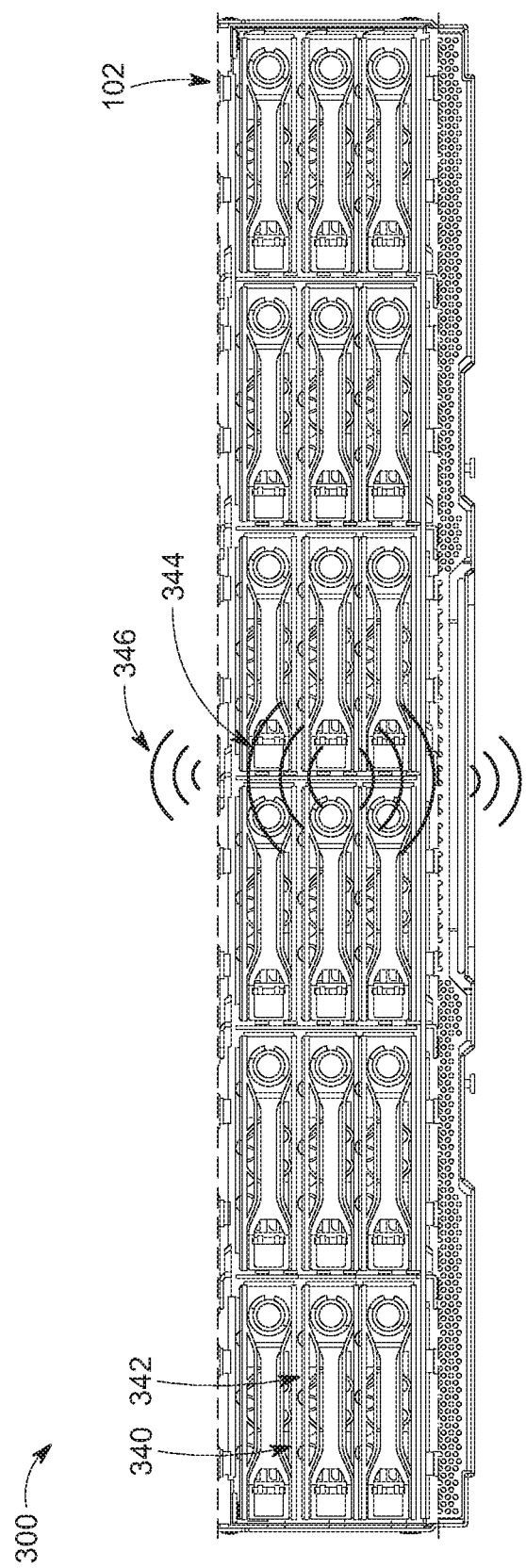
FIG. 21 is a front view illustration showing HDDs installed within compartments of the HDD cage assembly and illustrating vibration waves weakened by vibration isolators.

Referring to FIG. 21, the HD cage 300 shows a plurality of HDDs 342 received within a respective compartment 340. During operation, each HDD 342 generates initial, large vibrations 344 that are reduced to weaker vibrations 346 when passing through the vibration isolators 102. Thus, similar to the fan bay module 100, the HD cage 300 is beneficially assembled to reduce vibrations. The reduced, weaker vibrations are achieved based at least in part on the floating design that incorporates the vibration isolators 102.

Figure 22:
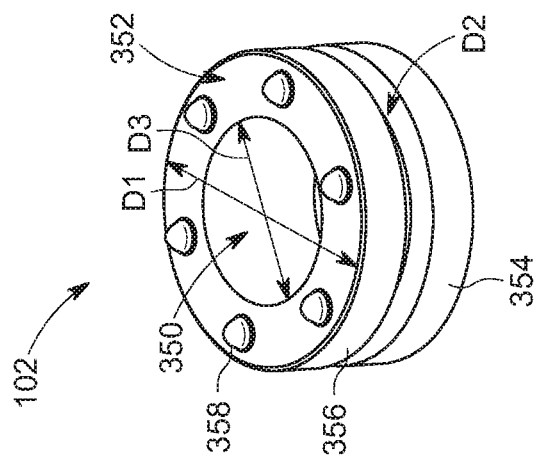
FIG. 22 is a perspective view showing a vibration isolator.

Referring to FIG. 22, each vibration isolator 102 has a general circular shape with an internal through-hole 350, i.e., a doughnut shape. Optionally, the vibration isolator 102 has a top section 352 that is separated from a bottom section 354 by an intermediate section 356. The top section 352 and the bottom section 354 have the same first outer diameter D1 (shown more clearly in FIG. 23). The intermediate section 356 has a second outer diameter D2 (shown more clearly in FIG. 23) that is relatively smaller than the first outer diameter D1 of the top and bottom sections 352, 354. The internal through-hole 350 has an inner diameter D3 that is smaller than both first and second outer diameters D1, D2.

Figure 23:
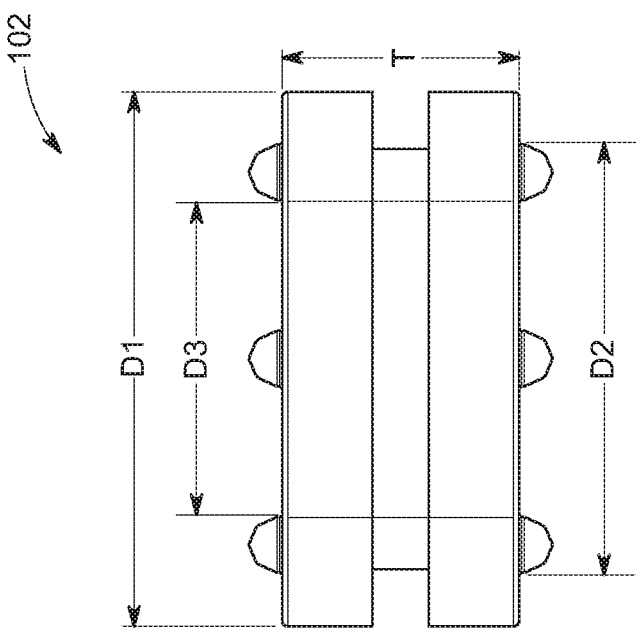
FIG. 23 is a side view of the vibration isolator of FIG. 22.

The vibration isolator 102 further optionally includes a plurality of dimples 358 that extend from both a top surface 360 and a bottom surface 362 (shown more clearly in FIG. 23). The dimples 358 are arranged in a symmetrical pattern, which in the illustrated example shows six dimples 358. One benefit of the dimples 358 is that they increase the material flexibility of the vibration isolator 102, enhancing the dissipation of vibration generated by moving components in an isolated vibration structure (e.g., the fan bay module 100 shown in FIGS. 1-8).

Referring to FIG. 23, in accordance with an exemplary embodiment, the first outer diameter D1 of the vibration isolator 102 is generally 9.5 millimeters (0.374 inches), the second outer diameter D2 is generally 7.5 millimeters (0.295 inches), and the inner diameter D3 is generally 5.6 millimeters (0.220 inches). The dimensions of the vibration isolator 102 are selected to facilitate assembly within the isolated vibration structure 100, as described below in reference to FIG. 24. Thus, in other embodiments different dimensions are selected than those provided above, for facilitating the vibration isolation benefits of the present disclosure.

Figure 24:
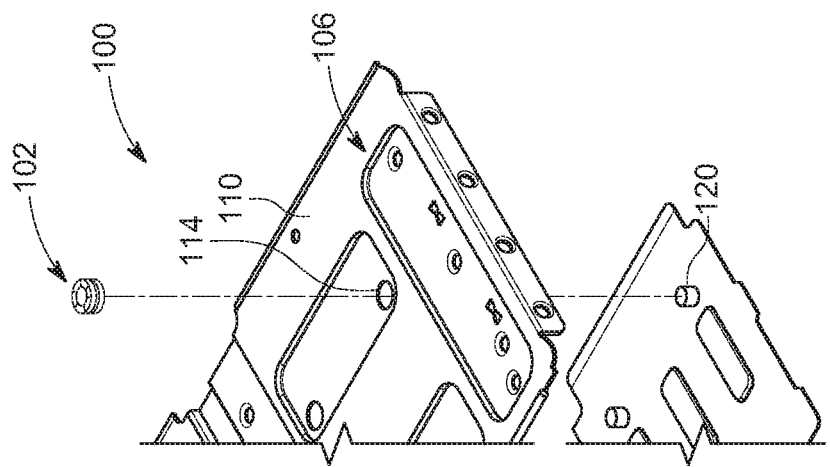
FIG. 24 is a partial perspective view illustrating assembly of a vibration isolator to a mounting post.

Referring to FIG. 24, the vibration isolator 102 is illustrated being assembled in the fan bay module 100. Specifically, the vibration isolator 102 is placed on the top surface 110 of the top plate 106. According to the illustrated example, the isolator hole 114 has a general diameter of 7.7 millimeters (0.303 inches), which is smaller than the first outer diameter D1 of 9.5 millimeters (0.374 inches). Thus, the isolator hole 114 prevents the vibration isolator 102 from passing through the surface of the top plate 106, retaining the vibration isolator 102 on the top surface 110.

According to this illustrated example, the mounting post 120 has a general diameter of 5.4 millimeters (0.213 inches), which is smaller than the 7.7 millimeters (0.303 inches) of the diameter of the isolator hole 114. As a result, the mounting post 120 is insertable through the isolator hole 114. Furthermore, the diameter of the mounting post 120 is slightly smaller than the inner diameter D3 of the vibration isolator 102, i.e., by 0.2 millimeters (0.008 inches). Accordingly, the mounting post 120 is insertable through the internal through-hole 350. The relatively small difference between the inner diameter D3 and the diameter of the mounting post 120 provides sufficient frictional interaction for retaining the vibration isolator 102 mounted to the top plate 106.

The mounting post 120 has a height sufficient to extend through a thickness of the top plate 106 and at least in part through a thickness T of the vibration isolator 102. Alternatively, instead of the mounting post 120, the vibration isolator 102 receives in the internal through-hole 350 a screw or other fastener that temporarily or permanently fixed the vibration isolator 102 in the desired place.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. An isolated vibration assembly for a computing device, the isolated vibration assembly comprising: a top assembly having a top plate; a base assembly having a base plate that is generally parallel to and offset from the top plate; a plurality of partition assemblies positioned generally perpendicularly between and connected to the top plate and the base plate, each adjacent pair of the plurality of partition assemblies defining an internal space with and being generally perpendicular to the top plate and the base plate; and a plurality of vibration isolators attached in an interspersed manner to one or more surfaces of the top plate, the base plate, or the plurality of partition assemblies; wherein the computing device is removably installed within one internal space, the computing device generates vibrations within the one internal space that are reduced when passing through the plurality of vibration isolators, and each partition assembly of the plurality of partition assemblies includes a partition plate, a partition damping bracket, and a partition flap.

2. The isolated vibration assembly of claim 1, wherein the partition flap is rotatably fixed to the partition plate.

3. The isolated vibration assembly of claim 1, wherein each of the plurality of vibration isolators is in direct contact with the one or more surfaces.

4. The isolated vibration assembly of claim 1, wherein each of the plurality of vibration isolators has a generally circular shape with an internal through-hole.

5. The isolated vibration assembly of claim 4, wherein each of the plurality of vibration isolators receives within the internal through-hole a securing post for frictional fastening to the one or more surfaces.

6. The isolated vibration assembly of claim 4, wherein each of the plurality of vibration isolators receives within the internal through-hole a screw for attachment to the one or more surfaces.

7. The isolated vibration assembly of claim 1, wherein one or more vibration isolators of the plurality of the vibration isolators connect the partition damping bracket to the partition plate.

8. The isolated vibration assembly of claim 1, wherein the computing device is retained within a frame that secures the computing device within the one internal space.

9. A computing device comprising: an isolated vibration assembly comprising: a top assembly having a top plate; a base assembly having a base plate that is generally parallel to and offset from the top plate; a plurality of partition assemblies positioned generally perpendicularly between and connected to the top plate and the base plate, each adjacent pair of the plurality of partition assemblies defining an internal space with and being generally perpendicular to the top plate and the base plate; and a plurality of vibration isolators attached in an interspersed manner to one or more surfaces of the top plate, the base plate, or the plurality of partition assemblies; and a computing device removably installed within one internal space, wherein the computing device generates vibrations within the one internal space that are reduced when passing through the plurality of vibration isolators, and each partition assembly of the plurality of partition assemblies includes a partition plate, a partition damping bracket, and a partition flap, and the partition flap is rotatably fixed to the partition plate.

10. The computing device of claim 9, wherein the computing device is retained within a frame that secures the computing device within the one internal space.

11. The computing device of claim 9, wherein each of the plurality of vibration isolators consists of a material selected from a group consisting of a rubber material and a spring material.

12. The computing device of claim 9, wherein each of the plurality of vibration isolators is in direct contact with the one or more surfaces.

13. The computing device of claim 9, wherein each of the plurality of vibration isolators has a generally circular shape with an internal through-hole.

14. The computing device of claim 13, wherein each of the plurality of vibration isolators receives within the internal through-hole a securing post for frictional fastening to the one or more surfaces.

15. The computing device of claim 13, wherein each of the plurality of vibration isolators receives within the internal through-hole a screw for attachment to the one or more surfaces.

\* \* \* \* \*